United States Patent
Deshpande et al.

(10) Patent No.: US 7,848,129 B1
(45) Date of Patent: Dec. 7, 2010

(54) DYNAMICALLY PARTITIONED CAM ARRAY

(75) Inventors: Chetan Deshpande, San Jose, CA (US);
Vinay Iyengar, Cupertino, CA (US);
Bindiganavale S. Nataraj, Cupertino, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 266 days.

(21) Appl. No.: 12/275,160

(22) Filed: Nov. 20, 2008

(51) Int. Cl.
*G11C 15/00* (2006.01)

(52) U.S. Cl. .............................. 365/49.17; 365/49.186; 365/49.1

(58) Field of Classification Search .............. 365/49.17, 365/49.16, 49.1
See application file for complete search history.

(56) References Cited

U.S. PATENT DOCUMENTS

| | | | |
|---|---|---|---|
| 4,244,033 A | 1/1981 | Hattori | |
| 4,656,626 A | 4/1987 | Yudichak et al. | |
| 4,670,858 A | 6/1987 | Almy | |
| 4,845,668 A | 7/1989 | Sano et al. | |
| 4,958,377 A | 9/1990 | Takahashi | |
| 4,996,666 A | 2/1991 | Duluk, Jr. | |
| 5,053,991 A | 10/1991 | Burrows | |
| 5,123,105 A | 6/1992 | Wyland et al. | |
| 5,319,589 A | 6/1994 | Yamagata et al. | |
| 5,383,146 A | 1/1995 | Threewitt | |
| 5,440,715 A | 8/1995 | Wyland | |
| 5,448,733 A | 9/1995 | Satoh et al. | |
| 5,485,418 A | 1/1996 | Hiraki et al. | |
| 5,555,397 A | 9/1996 | Sasama et al. | |
| 5,642,322 A | 6/1997 | Yondea | |
| 5,649,149 A | 7/1997 | Stormon et al. | |
| 5,706,224 A | 1/1998 | Srinivasan et al. | |
| 5,818,786 A | 10/1998 | Yoneda | |
| 5,860,085 A | 1/1999 | Stormon et al. | |
| 5,870,324 A | 2/1999 | Helwig et al. | |
| 5,920,886 A | 7/1999 | Feldmeier | |
| 5,946,704 A | 8/1999 | Yoneda et al. | |
| 5,999,435 A | 12/1999 | Henderson et al. | |
| 6,081,442 A | 6/2000 | Igarashi et al. | |
| 6,195,278 B1 * | 2/2001 | Calin et al. | 365/49.17 |
| 6,324,087 B1 | 11/2001 | Pereira | |
| 6,768,659 B2 | 7/2004 | Gillingham et al. | |
| 6,804,134 B1 | 10/2004 | Proebstiing et al. | |

(Continued)

FOREIGN PATENT DOCUMENTS

| | | |
|---|---|---|
| EP | 0 381 249 A2 | 8/1990 |
| EP | 0 872 802 A2 | 10/1998 |
| EP | 1 713 082 A1 | 10/2006 |

*Primary Examiner*—Huan Hoang
(74) *Attorney, Agent, or Firm*—Mahamedi Paradice Kreisman LLP; William L. Paradice, III

(57) ABSTRACT

A content addressable memory (CAM) device includes a comparand register, a CAM array, and partition logic. The comparand register has inputs to receive a search key, and outputs coupled to the CAM array, which includes a plurality of individually selectable sub-arrays. Each sub-array includes a number of rows of CAM cells and a control circuit, wherein each row of CAM cells is coupled to a match line, and wherein the control circuit has an input to receive a corresponding sub-array enable signal. The partition logic has an input to receive a partition select signal, and is configured to generate the sub-array enable signals in response to the partition select signal. The control circuits selectively propagate the search key through the sub-arrays in response to the sub-array enable signals.

40 Claims, 11 Drawing Sheets

U.S. PATENT DOCUMENTS

| | | |
|---|---|---|
| 6,829,153 B1 | 12/2004 | Park et al. |
| 6,934,795 B2 | 8/2005 | Nataraj et al. |
| 6,944,709 B2 | 9/2005 | Nataraj et al. |
| 6,972,978 B1 | 12/2005 | Miller et al. |
| 7,043,601 B2 * | 5/2006 | McKenzie et al. .......... 711/108 |
| 7,096,318 B2 | 8/2006 | Jalowiecki et al. |
| 7,185,141 B1 * | 2/2007 | James et al. ................ 711/108 |
| 7,193,874 B1 | 3/2007 | Pereira et al. |

* cited by examiner

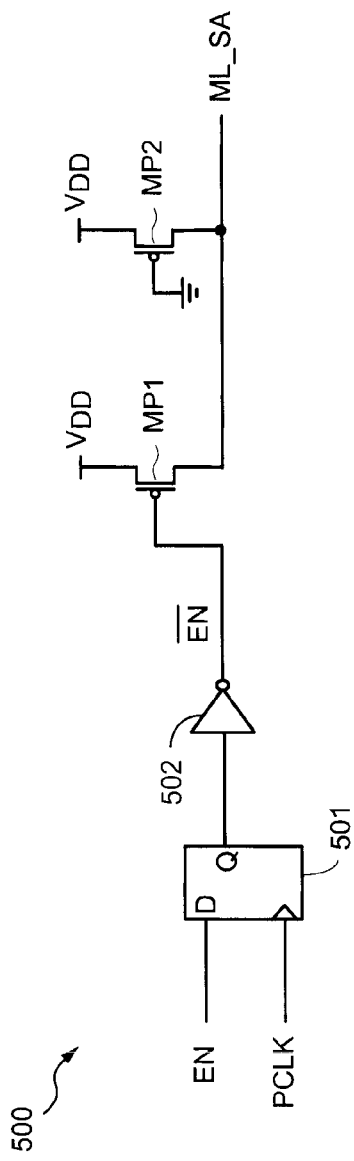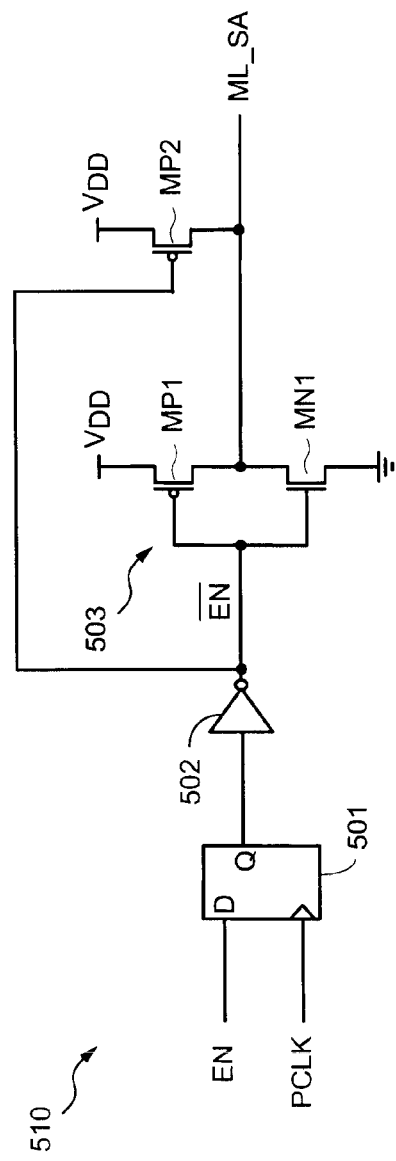

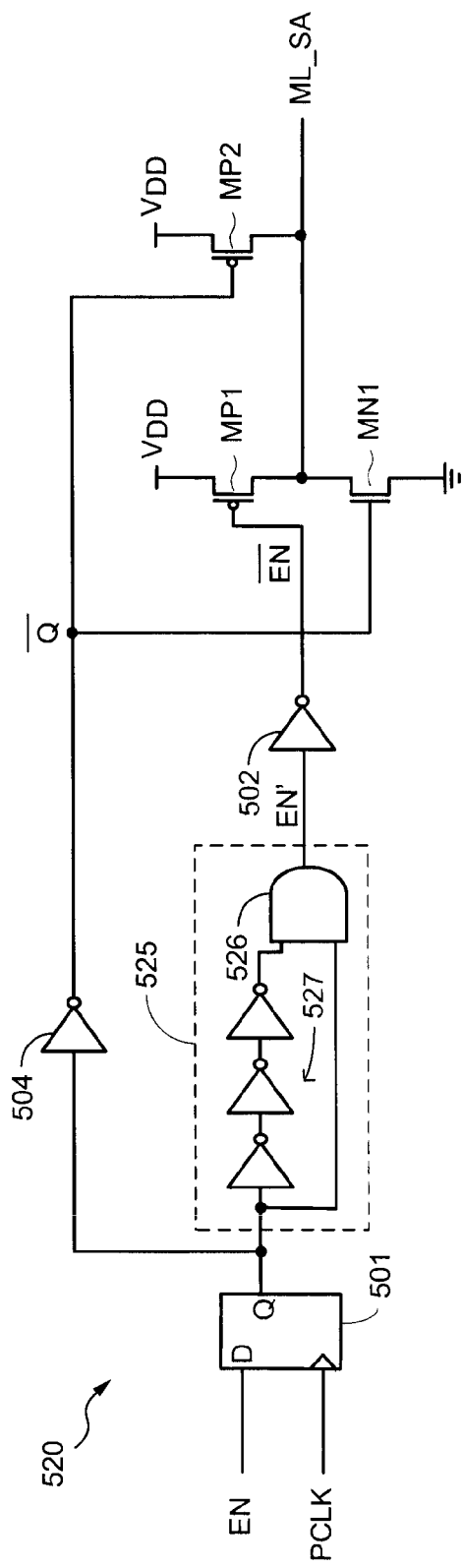
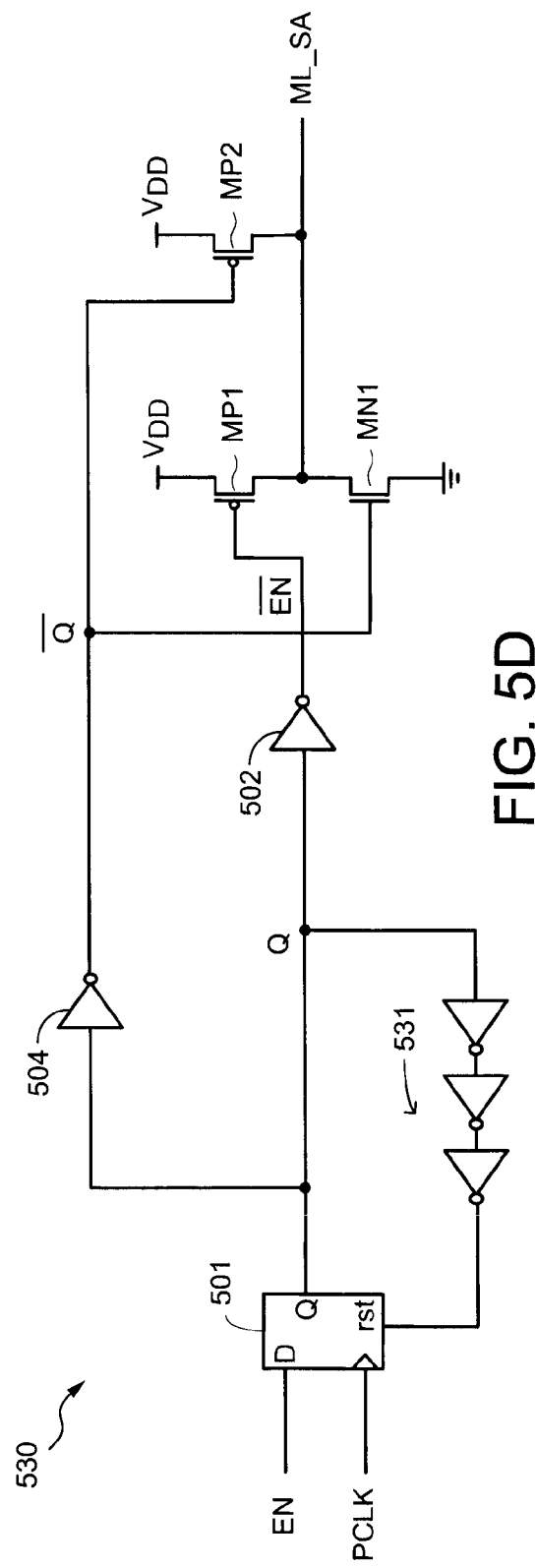
FIG. 5C
FIG. 5D

DYNAMICALLY PARTITIONED CAM ARRAY

FIELD OF INVENTION

This invention relates generally to semiconductor memories and specifically to reducing power consumption in content addressable memories.

DESCRIPTION OF RELATED ART

Content addressable memory (CAM) devices are frequently used in network switching and routing applications to determine forwarding destinations for data packets. A CAM device can be instructed to compare a selected portion of an incoming packet (e.g., a destination address extracted from the packet header) with CAM words (e.g., forwarding address) stored in an array within the CAM device. If there is a matching entry stored in the CAM array, the index of the matching CAM word can be used to access a corresponding location in an associated memory device to retrieve a destination address and/or other routing information for the packet.

A CAM device includes a CAM array having a plurality of CAM cells organized in a number of rows and columns. Each row of CAM cells, which can be used to store a CAM word, is coupled to a corresponding match line that indicates match results for the row. Each column of CAM cells is typically coupled to one or more data lines or data line pairs that can be used to drive data into a selected CAM row during write operations and/or for providing a search key to the CAM rows during compare operations. During a compare operation, the search key (e.g., the comparand word) is provided to the CAM array and compared with the CAM words stored therein. For each CAM word that matches the search key, a corresponding match line is asserted to indicate the match result. If any of the match lines are asserted, a match flag is asserted to indicate the match condition, and a priority encoder determines the match address or index of the highest priority matching entry in the CAM array.

For many CAM arrays, the match lines are pre-charged toward a supply voltage (e.g., to logic high) prior to the compare operation. Then, during the compare operation, the search key is provided to all the CAM rows in the array by driving each bit of the search key onto the comparand line of a corresponding column of the array. If the CAM word stored in a row matches the search key, the row's match line remains in its charged state to indicate a match condition for the row. Conversely, if the CAM word stored in a row does not match the search key, the row's match line is discharged toward ground potential (e.g., to logic low) by the one or more mismatching CAM cells to indicate a mismatch condition for the row. The discharged match lines are then pre-charged to the supply voltage prior to the next compare operation.

Because most of the rows in the CAM array typically mismatch during each compare operation, most of the array's match lines are alternately charged and then discharged during successive compare operations, which results in significant power consumption. Further, driving the search key to every row of the CAM array for each compare operation also consumes significant power. For example, in CAM architectures that utilize complementary comparand line pairs to drive the search key to the CAM rows, one of the comparand lines for each column in the array will be driven to logic high regardless of the logic state of the corresponding bit of the search key (e.g., because depending on the state of the search key bit, either the comparand line or the complementary comparand will be driven high). Thus, half of all the comparand lines are driven high (e.g., towards VDD) for every compare operation, which consumes significant power. This undesirable power consumption increases as the number of rows of CAM cells increases, which requires longer comparand lines having greater line capacitances.

Thus, it would be desirable to minimize the power consumption of a CAM array during compare operations.

BRIEF DESCRIPTION OF THE DRAWINGS

FIG. 5A is a circuit diagram of one embodiment of the match line pre-charge circuit of FIG. 3;

FIG. 5B is a circuit diagram of another embodiment of the match line pre-charge circuit of FIG. 3;

FIG. 5C is a circuit diagram of yet another embodiment of the match line pre-charge circuit of FIG. 3;

FIG. 5D is a circuit diagram of yet another embodiment of the match line pre-charge circuit of FIG. 3;

Like reference numerals refer to corresponding parts throughout the drawing figures.

DETAILED DESCRIPTION

Figure 1A:
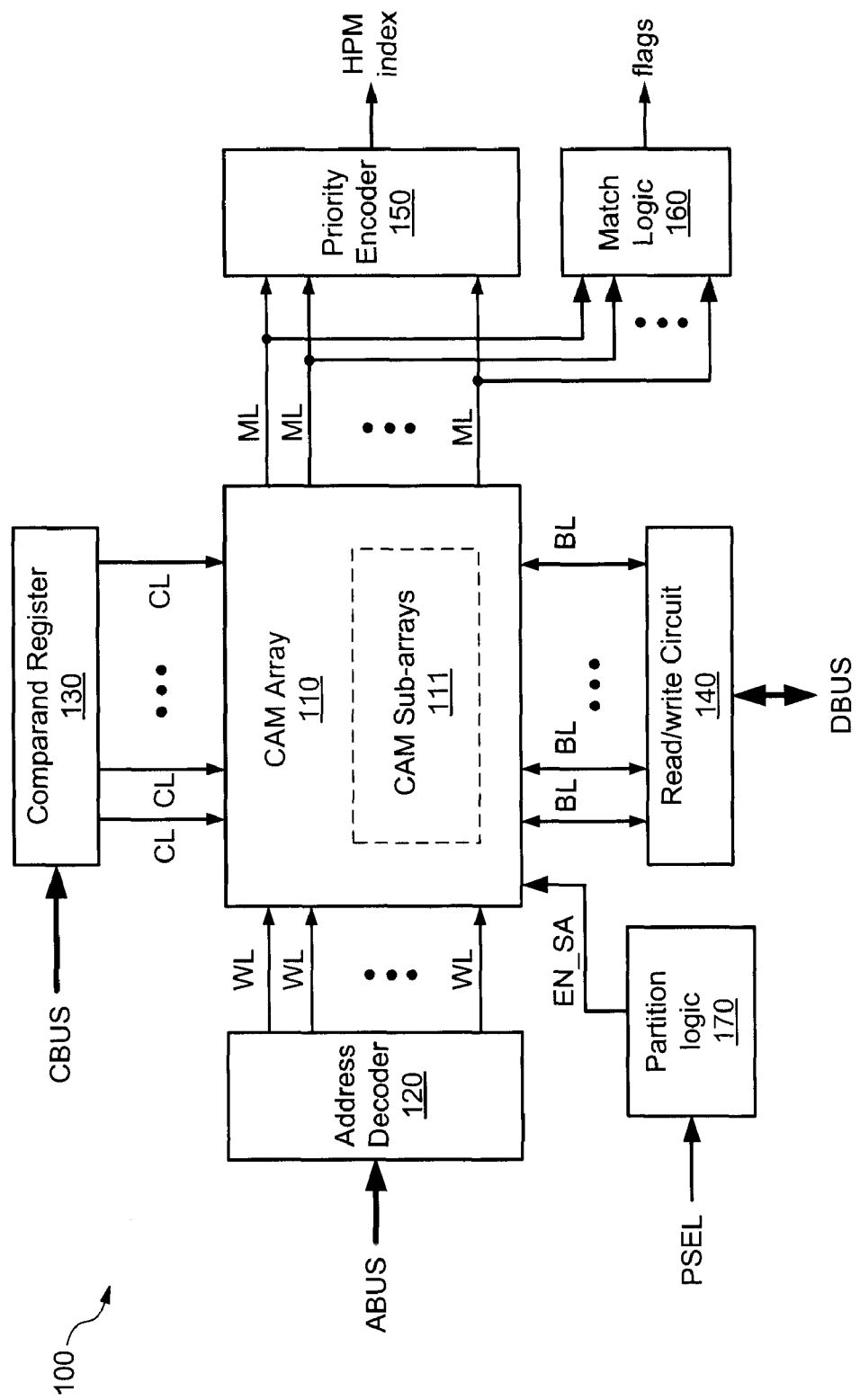
FIG. 1A is a simplified block diagram of a CAM device in accordance with some embodiments.

A method and apparatus for reducing power consumption in a CAM device is disclosed. It is to be understood that embodiments of the present invention are equally applicable to other memory structures such as, for example, RAM, EPROM, EEPROM, and flash memory devices, as well as other memory architectures including, for example, translation look-aside buffers (TLBs) and look-up tables (LUTs). In the following description, for purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present invention is not to be construed as limited to specific examples described herein but rather includes within its scope all embodiments defined by the appended claims.

Embodiments of the present invention can reduce the power consumption of a CAM device during a compare operation between a search key and CAM words stored in the device's CAM array by selectively disabling one or more portions of the CAM array during the compare operation. For some embodiments, the match lines of the CAM rows in the disabled portions are not pre-charged prior to the compare operation, and the search key is not driven onto the comparand lines of the disabled portions during the compare operation. In this manner, power consumption associated with charging and discharging the match lines of all the rows in the CAM array is reduced, and power consumption associated with driving the search key to all the rows in the CAM array is reduced.

In accordance with present embodiments, the CAM device includes a dynamically configurable CAM array having a plurality of CAM cells arranged in any number of rows and columns. Each row of CAM cells is connected to an address decoder via a corresponding word line, and is connected to a priority encoder via a corresponding match line. Each column of CAM cells is coupled to a comparand line or comparand line pair that can receive a corresponding bit of a search key. The CAM device also includes partition logic having an input to receive a partition select signal that indicates which portions of the CAM array are to be enabled (and which portions of the CAM array are to be disabled) during compare operations.

More specifically, for some embodiments, the CAM array is logically divided into a number of sub-arrays that can be individually selected to participate in compare operations in response to the partition select signal. Each CAM sub-array includes one or more of the rows of CAM cells of the array, and includes a control circuit responsive to a corresponding sub-array enable signal generated by the partition logic. During a compare operation, if a sub-array enable signal is asserted, the corresponding sub-array is enabled and the data stored therein participates in the compare operation. Conversely, if a sub-array enable signal is de-asserted, the corresponding sub-array is disabled and the data stored therein does not participate in the compare operation. The disabled sub-arrays consume minimal power during the compare operation, as explained in more detail below. In this manner, sub-arrays that do not store valid data and/or that store data which is not relevant for a particular compare operation can be dynamically disabled for the compare operation, thereby reducing power consumption of the CAM device.

For some embodiments, each sub-array's control circuit includes a comparand driver circuit and a number of match line pre-charge circuits. In response to the sub-array enable signal, the driver circuit selectively drives the search key onto the comparand lines of the corresponding sub-array, and the match line pre-charge circuits selectively pre-charge the match lines of the CAM rows of the corresponding sub-array. Thus, if a sub-array enable signal is de-asserted to disable its corresponding sub-array, the driver circuit does not drive the search key onto the sub-array's comparand lines, and the match line pre-charge circuits do not pre-charge the match lines of the CAM rows of the sub-array prior to compare operations. Thus, by disabling a sub-array, power consumption associated with driving a search key to all the rows of CAM cells in the CAM array is reduced, and power consumption associated with alternately charging and discharging all the match lines in the CAM array during successive compare operations is reduced.

FIG. 1A shows a CAM device 100 having a CAM array 110 that can be dynamically partitioned into a number of sub-arrays 111 in accordance with present embodiments. CAM device 100 is shown to include CAM array 110, an address decoder 120, a comparand register 130, a read/write circuit 140, a priority encoder 150, match logic 160, and partition logic 170. One or more instructions and related control signals can be provided to CAM device 100 from an instruction decoder (not shown for simplicity) to control read, write, compare, initialization, and other operations for CAM device 100. Other well-known signals that can be provided to CAM device 100, such as enable signals, clock signals, and power connections, are not shown for simplicity.

CAM array 110 includes a plurality of rows, each including any number of CAM cells (not shown in FIG. 1A for simplicity) for storing a corresponding CAM word. Each row of CAM cells in array 110 is coupled to address decoder 120 via a corresponding word line WL, and is also coupled to priority encoder 150 and to match logic 160 via a corresponding match line ML. Further, although not shown in FIG. 1A, each row of CAM cells in CAM array 110 can include one or more validity bits to indicate whether the corresponding row (or any segment thereof) of CAM cells stores valid data. In addition, for some embodiments, CAM device 100 includes a well-known match latch circuit (not shown for simplicity) coupled between the match lines ML and priority encoder 150 to latch match results generated in CAM array 110 during compare operations.

For some embodiments, the rows in CAM array 110 may be divided into a plurality of row segments, for example, to reduce the capacitive loading for each row and/or to provide multiple width/depth configurations for the array. For one embodiment, the segmented rows of CAM array 110 may be programmed to operate in various width and depth configurations to accommodate CAM words of varying lengths as described, for example, in U.S. Pat. No. 6,243,281 to Pereira, which is assigned to the assignee of the present invention and incorporated herein by reference.

The columns of CAM cells in CAM array 110 are coupled to comparand register 130 via comparand lines CL, and are coupled to read/write circuit 140 via bit lines BL. Comparand register 130 is well-known, and is configured to provide a search key (e.g., a comparand word) received from a comparand bus (CBUS) to CAM array 110 for compare operations with CAM words stored therein. For other embodiments, the search key can be provided to CAM array 110 via another bus and/or circuit. Read/write circuit 140 includes well-known write drivers to write CAM words received from a data bus (DBUS) to CAM array 110, and includes well-known sense amplifiers to read CAM words from CAM array 110 onto DBUS. For other embodiments, read/write circuit 140 may be coupled to a bus other than DBUS.

Address decoder 120 is well-known, and includes circuitry to select corresponding rows in CAM array 110 for read, write, and/or other operations in response to an address received from an address bus (ABUS). For other embodiments, addresses may be provided to address decoder 120 from another suitable bus and/or circuitry.

The match lines ML provide match results for compare operations between the search key provided by comparand register 130 and CAM words stored in CAM array 110 to priority encoder 150 and to match logic 160. In response thereto, priority encoder 150 determines the matching entry that has the highest priority number associated with it and generates the index or address of this highest priority match (HPM) in a well-known manner. In addition, priority encoder 150 can use the validity bits (not shown in FIG. 1A) from CAM array 110 to generate the next free address (NFA) that is available in CAM array 110 for storing new data. For some embodiments, priority encoder 150 provides the NFA as an input address to address decoder 120.

Match logic 160, which is well-known, uses the match results indicated on ML to generate a match flag indicative of a match condition in CAM array 110. If there is more than one matching entry in CAM array 110, match logic 160 may generate a multiple match flag to indicate a multiple match condition. In addition, match logic 160 may use the validity bits from CAM array 110 to assert a full flag when all of the rows of CAM cells in CAM array 110 are filled with valid entries.

Partition logic 170 includes an input to receive a partition select signal (PSEL) that indicates which CAM sub-arrays 111 are to be enabled for a compare operation and which CAM sub-arrays 111 are to be disabled for the compare operation. In response to PSEL, partition logic 170 generates the CAM sub-array enable signals (EN_SA) which can be used to selectively disable one or more sub-arrays (e.g., groups of CAM rows) during compare operations. The disabled sub-arrays 111 consume very little power during compare operations in CAM array 110, and therefore power consumption of CAM array 110 can be reduced by enabling only the sub-arrays 111 in CAM array 110 that need to participate in the compare operation. As mentioned above, power consumption can be minimized by not driving the search key onto the comparand lines of the disabled sub-arrays during compare operations, and/or by not pre-charging the match lines of the disabled sub-arrays prior to compare operations.

The signal PSEL can be generated and provided to partition logic 170 using any suitable circuitry. For example, for some embodiments, PSEL can be dynamically generated (e.g., by a user or host system) and provided to partition logic 170. For other embodiments, PSEL can be generated in response to the search key, or alternatively can be provided to CAM device 100 along with the search key (e.g., to indicate which sub-arrays are to participate in compare operations with the search key). Further, for some embodiments, PSEL can be stored in a suitable memory element (not shown for simplicity) provided within or associated with CAM device 100.

Further, although not shown in FIG. 1A for simplicity, CAM device 100 may include one or rows of redundant CAM cells that can be enabled to functionally replace defective rows of CAM cells in CAM array 110 as described, for example, in U.S. Pat. No. 6,275,426, in U.S. Pat. No. 6,249,467, and/or in U.S. Pat. No. 6,865,098, all of which are incorporated by reference herein.

Figure 1B:
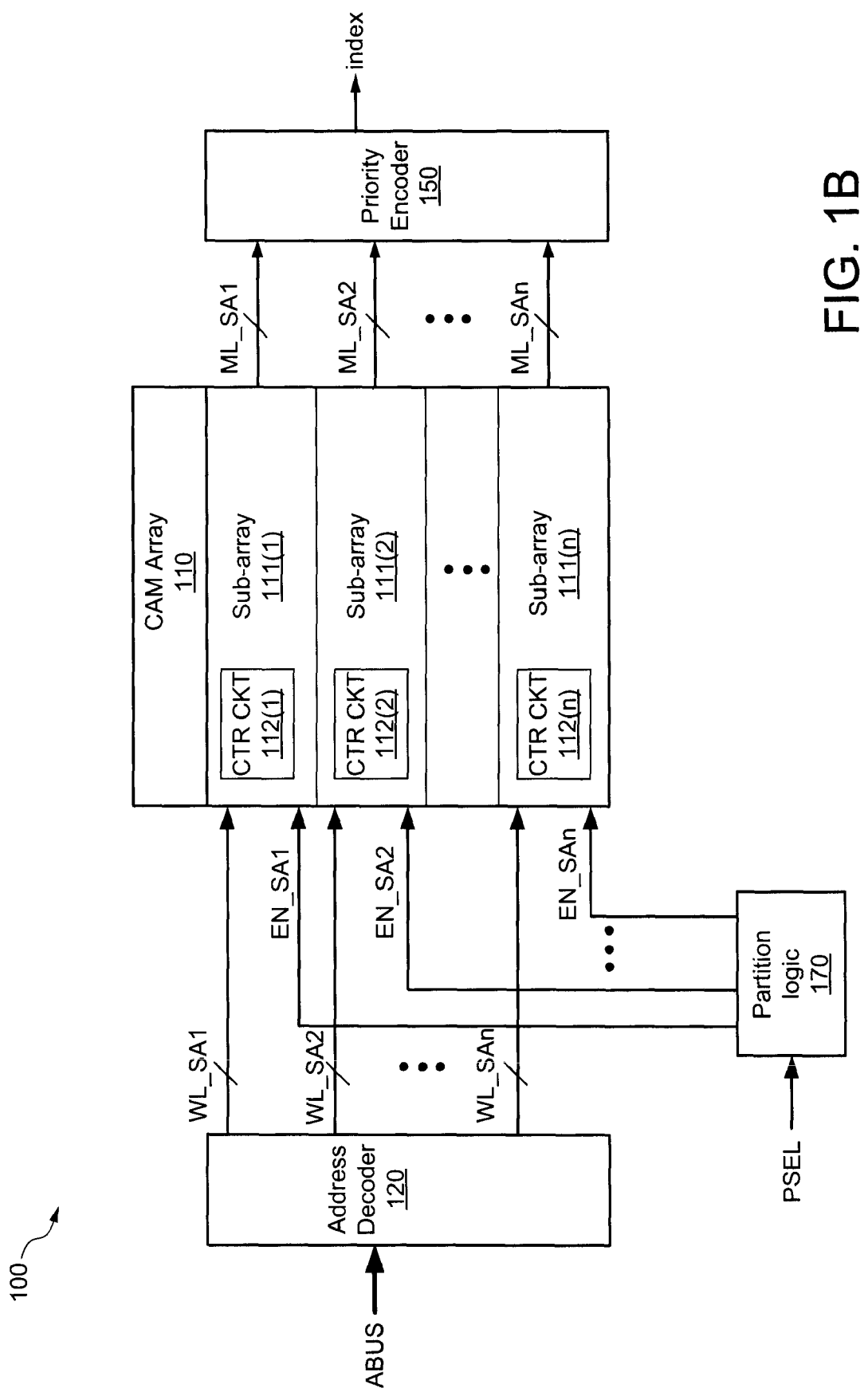
FIG. 1B is a block diagram of the CAM array of FIG. 1A.

More specifically, FIG. 1B shows an exemplary embodiment of CAM array 110 as including a plurality of individually selectable CAM sub-arrays 111(1)-111(n). Each CAM sub-array 111 includes one or more rows of CAM cells (not individually shown in FIG. 1B), and includes a control circuit 112 having an input to receive a corresponding sub-array enable signal (EN_SA) from partition logic 170. The rows of CAM cells within each sub-array 111 are connected to address decoder 120 via corresponding sub-array word lines (WL_SA), and are connected to priority encoder 150 (and, although not shown in FIG. 1B, also to match logic 160) via corresponding sub-array match lines (ML_SA). In this manner, every row of CAM cells in array 110 is connected to the same address decoder 120, and can therefore be addressed by a single address provided to address decoder 120. Similarly, every row of CAM cells in array 110 is connected to the same priority encoder 150, and can therefore participate in the generation of the HPM index provided by priority encoder 150.

Thus, for purposes of discussion herein, each group of sub-array word lines WL_SA1-WL_SAn shown in FIG. 1B is a subset of the word lines WL shown in FIG. 1A, and each group of sub-array match lines ML_SA1-ML_SAn is a subset of the match lines ML shown in FIG. 1A. For example, CAM sub-array 111(1) includes a number of rows of CAM cells connected to address decoder 120 via sub-array word lines WL_SA1 and connected to priority encoder 150 via sub-array match lines ML_SA1, CAM sub-array 111(2) includes a number of rows of CAM cells connected to address decoder 120 via sub-array word lines WL_SA2 and connected to priority encoder 150 via sub-array match lines ML_SA2, and so on.

Partition logic 170 generates the sub-array enable signals EN_SA1-EN_SAn in response to PSEL, which indicates which CAM sub-arrays 111 are to be enabled for a compare operation and which CAM sub-arrays 111 are to be disabled for the compare operation. For purposes of discussion herein, if the CAM sub-array's enable signal is asserted, the sub-array is enabled for the compare operation (e.g., by its control circuit 112), and the data stored therein is allowed to participate in the compare operation. Conversely, if the CAM sub-array's enable signal is de-asserted, the CAM sub-array is disabled for the compare operation (e.g., by its control circuit 112), and the data stored therein does not participate in the compare operation. For some embodiments, PSEL can be generated for every compare operation. For other embodiments, PSEL can be stored in a suitable memory element (not shown for simplicity) and used for numerous compare operations in CAM array 110.

Thus, each CAM sub-array 111 can be enabled by asserting its corresponding sub-array enable signal, and can be disabled by de-asserting its corresponding sub-array enable signal. Further, as mentioned above, the disabled sub-arrays 111 consume minimal power during compare operations, and therefore power consumption of CAM array 110 can be minimized by enabling only the sub-arrays 111 of CAM array 110 that need to participate in the compare operation.

Present embodiments are especially useful when only a portion of the CAM array 110 contains valid data. For example, if the CAM array 110 is dynamically partitioned into N sub-arrays 111, and only P of the sub-arrays 111 contain valid data, then the unused N−P=M sub-arrays 111 can be disabled for compare operations, thereby virtually eliminating power consumption in the M unused sub-arrays 111. In this manner, overall power consumption of the CAM device 100 can be significantly reduced by disabling CAM sub-arrays 111 that are not deemed relevant to the compare operations (e.g., by disabling CAM sub-arrays 111 that do not store valid data and/or that store data that is not desired to participate in the compare operation.

Further, because the reduction in power consumption achieved by the present embodiments is proportional to the number of sub-arrays 111 that do not participate in the compare operation (e.g., the number of disabled sub-arrays), it can be desirable to arrange the data stored in the CAM array 110 in a manner that occupies as few sub-arrays 111 as possible, thereby maximizing the number of unused sub-arrays 111 that can be disabled for compare operations. For some embodiments, CAM device 100 can include well-known table management tools (not shown for simplicity) that maintain valid data in contiguous rows of CAM cells in the array 110, and/or that writes new data into available locations in used sub-arrays 111 prior to writing the new data into a previously unused sub-array 111 to minimize the number of sub-arrays 111 required to store the data.

As mentioned above, the CAM device 100 minimizes power consumption during compare operations by preventing the match lines of the disabled sub-arrays from being pre-charged prior to the compare operation and by preventing the search key from being driven onto the comparand lines of the disabled sub-arrays during the compare operation. For other embodiments, the CAM device can be configured to only prevent the match lines of the disabled sub-arrays from being pre-charged prior to the compare operation (e.g., and to propagate the search key to the next sub-array). For still other embodiments, the CAM device 100 can be configured to only prevent the search key from being driven into the disabled sub-arrays 111 (e.g., and to not disable match line pre-charging operations).

Figure 2A:
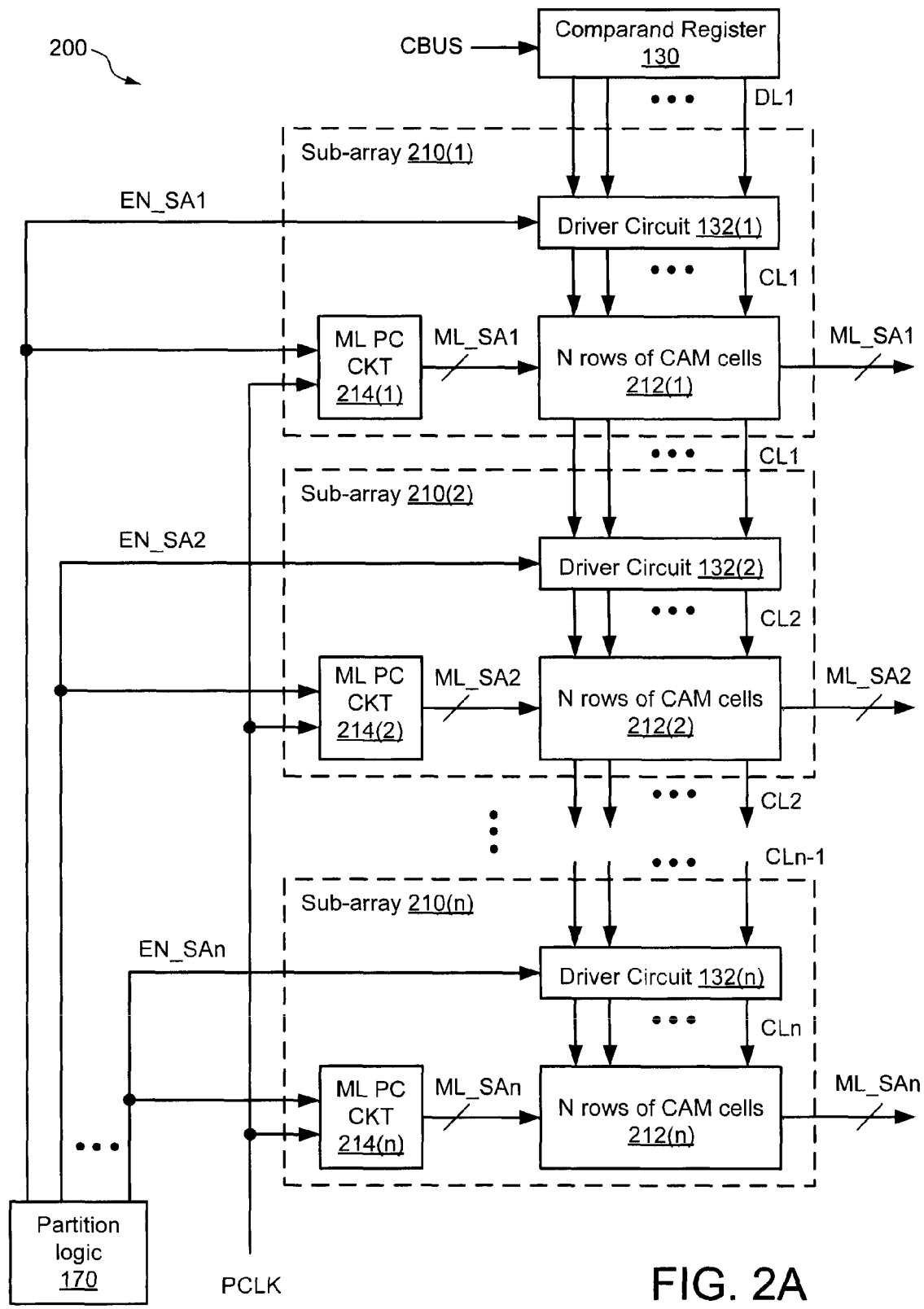
FIG. 2A is a functional block diagram of some embodiments of the CAM array of FIGS. 1A and 1B.

FIG. 2A shows a CAM array 200 that is one embodiment of CAM array 110 of FIGS. 1A-1B. The CAM array 200 is shown to include a plurality of CAM sub-arrays 210(1)-210(n), comparand register 130, and partition logic 170. Each CAM sub-array 210 includes a number of rows of CAM cells 212, a match line pre-charge circuit 214, a comparand driver circuit 132, a number of associated complementary comparand line pairs CL, and an input to receive a corresponding sub-array enable signal (EN_SA). For some embodiments, the match line pre-charge circuits 214 and the driver 132 within each sub-array 210 form the sub-array's control circuit 112, which as discussed below can selectively enable, disable, and partially disable the sub-array 210 in response to EN_SA.

For some embodiments, the CAM sub-arrays 210 can each include the same number of rows of CAM cells. For other embodiments, the CAM sub-arrays 210 can include different numbers of rows of CAM cells.

Each set of comparand line pairs is coupled to the columns of CAM cells in a corresponding sub-array 210, and extend between the driver circuit 132 of the corresponding sub-array and the driver circuit 132 in the next (e.g., downstream) sub-array. Although not shown in FIG. 2A for simplicity, for exemplary embodiments described herein, each comparand line CL is associated with a complementary comparand line, where the comparand line provides a bit of the search key to a column of CAM cells in an associated sub-array 210, and the complementary comparand line provides a logical complement of the search key bit to the column of CAM cells in the associated sub-array 210.

Each driver circuit 132 includes a number of data outputs connected to the set of comparand lines in its sub-array 210, a number of data inputs connected to the the set of comparand lines in a previous sub-array 210, and a control input to receive the corresponding sub-array enable signal (EN_SA). For example, driver circuit 132(1) has data inputs connected to comparand register 130 via data lines DL, data outputs connected to the comparand line pairs CL1 in the corresponding first sub-array 210(1), and a control input to receive EN_SA1. Similarly, driver circuit 132(2) includes data inputs connected to the comparand line pairs CL1 in the previous sub-array 210(1), data outputs connected to the comparand lines CL2 in the corresponding second sub-array 210(2), and a control input to receive EN_SA2. For other embodiments, driver circuits 132 may also include a clock input to receive a compare clock (e.g., CLK) that allows the driver circuits 132 to operation in a synchronous manner.

Each match line pre-charge circuit 214 includes a first input to receive a pre-charge clock signal (PCLK), a second input to receive the corresponding sub-array enable signal (EN_SA), and outputs coupled to the match lines (ML_SA) of the rows of CAM cells 212 in the corresponding sub-array 210. For example, pre-charge circuit 214(1) includes inputs to receive PCLK and EN_SA1, and includes outputs coupled the match lines ML_SA1 of CAM rows 212(1) in the first sub-array 210(1), pre-charge circuit 214(2) includes inputs to receive PCLK and EN_SA2, and includes outputs coupled the match lines ML_SA2 of CAM rows 212(2) in the second sub-array 210(2), and so on.

As mentioned above, the CAM sub-arrays 210 can be individually enabled and disabled in response to the sub-array enable signals EN_SA to minimize power consumption during compare operations. More specifically, for each CAM sub-array 210, the corresponding EN_SA signal can determine whether the match line pre-charge circuits 214 selectively pre-charge the match lines in the sub-array 210 for a compare operation. For example, if EN_SA1 is asserted (e.g., to enable the first sub-array 210(1)), match line pre-charge circuit 214(1) pre-charges the match lines ML_SA1 of the first sub-array 210(1) upon a triggering edge of PCLK so that the corresponding rows of CAM cells 212(1) can indicate a match condition with the search key on ML_SA1. Conversely, if EN_SA1 is de-asserted (e.g., to disable sub-array 210(1)), match line pre-charge circuit 214(1) does not pre-charge match lines ML_SA1 of sub-array 210(1), thereby preventing the data words stored therein from participating in the compare operation. For some embodiments, de-assertion of EN_SA1 causes match line pre-charge circuit 214(1) to maintain ML_SA1 in a discharged or logic low state, thereby forcing a mismatch condition on ML_SA1. In this case, power consumption is reduced by not pre-charging the match lines ML_SA1 of the first sub-array 210(1).

Also, for each CAM sub-array 210, the corresponding EN_SA signal can determine whether the driver circuit 132 drives the search key onto the set of comparand lines in the sub-array 210 during the compare operation. For example, if EN_SA1 is asserted, the first sub-array's driver circuit 132(1) propagates the search key received from comparand register 130 to the CAM cells of first sub-array 210(1) by driving the search key onto the sub-array's set of comparand line pairs CL1. If EN_SA2 is also asserted, the second sub-array's driver circuit 132(2) propagates the search key received from the first sub-array 210(1) via its comparand line pairs CL1 to the CAM cells of second sub-array 210(2) by driving the search key onto the sub-array's set of comparand line pairs CL2. In this manner, the driver circuits 132(1)-132(n) selectively propagate the search key sequentially through the CAM sub-arrays 210(1)-210(n) in response to EN_SA1-EN_SAn, respectively.

Conversely, if EN_SA2 is de-asserted (e.g., to disable the second sub-array 210(2)), its driver circuit 132(2) does not propagate the search key onto the set of comparand lines CL2 in the second sub-array 210(2), thereby preventing the rows of CAM cells 212(2) of the second sub-array 210(2) from receiving the search key and thus from participating in the compare operation. For some embodiments, if the sub-array enable signal is de-asserted, the driver circuit 132 maintains the comparand line pairs of its sub-array 210 in the same predetermined state (e.g., in a logic low state), thereby eliminating power consumption associated with driving the sub-array's set of complementary comparand line pairs to different logic states for every compare operation.

Because the driver circuits 132(1)-132(n) selectively propagate the search key through adjacent sub-arrays 210(1)-210(n) in a sequential manner down the CAM array in response to EN_SA, the set of enabled sub-arrays 210 should be contiguous with each other beginning with the first sub-array 210(1), and the set of disabled sub-arrays 210 should be downstream from the enabled sub-arrays 210. Otherwise, if a sub-array disabled for compare operations lies between two sub-arrays enabled for compare operations, the enabled sub-array 210 lying downstream from the disabled sub-array 210 may not receive the search key during compare operations because the disabled sub-array will not propagate the search key to any subsequent sub-arrays 210.

For example, referring to FIG. 2A, if the first and third sub-arrays 210(1) and 210(3) are selected for a compare operation, and the second sub-array 210(2) is disabled for the compare operation, the de-asserted state of EN_SA2 causes the second sub-array's driver circuit 132(2) to not propagate the search key onto comparand line pairs CL2, thereby preventing the search key from reaching the third sub-array 210(3), and therefore also preventing the third sub-array 210 (3) from participating in the compare operation.

For other embodiments, the driver circuits 132 and the match line pre-charge circuits 214 of each sub-array 210 can be controlled by different enable signals so that each sub-array 210 can be partially disabled. For a partially disabled sub-array 210, its control circuit 112 can enable the sub-array's driver circuit 132 to propagate the search key received from a previous sub-array through the partially disabled sub-array to the next sub-array, and can simultaneously disable the sub-array's match line pre-charge circuits 214 so that the match lines of the partially disabled sub-array remain in their discharged state, thereby not only preventing data stored in the partially disabled sub-array from participating in the compare operation, but also reducing power consumption by not charging and discharging the match lines of the partially disabled sub-arrays for successive compare operations.

Figure 2B:
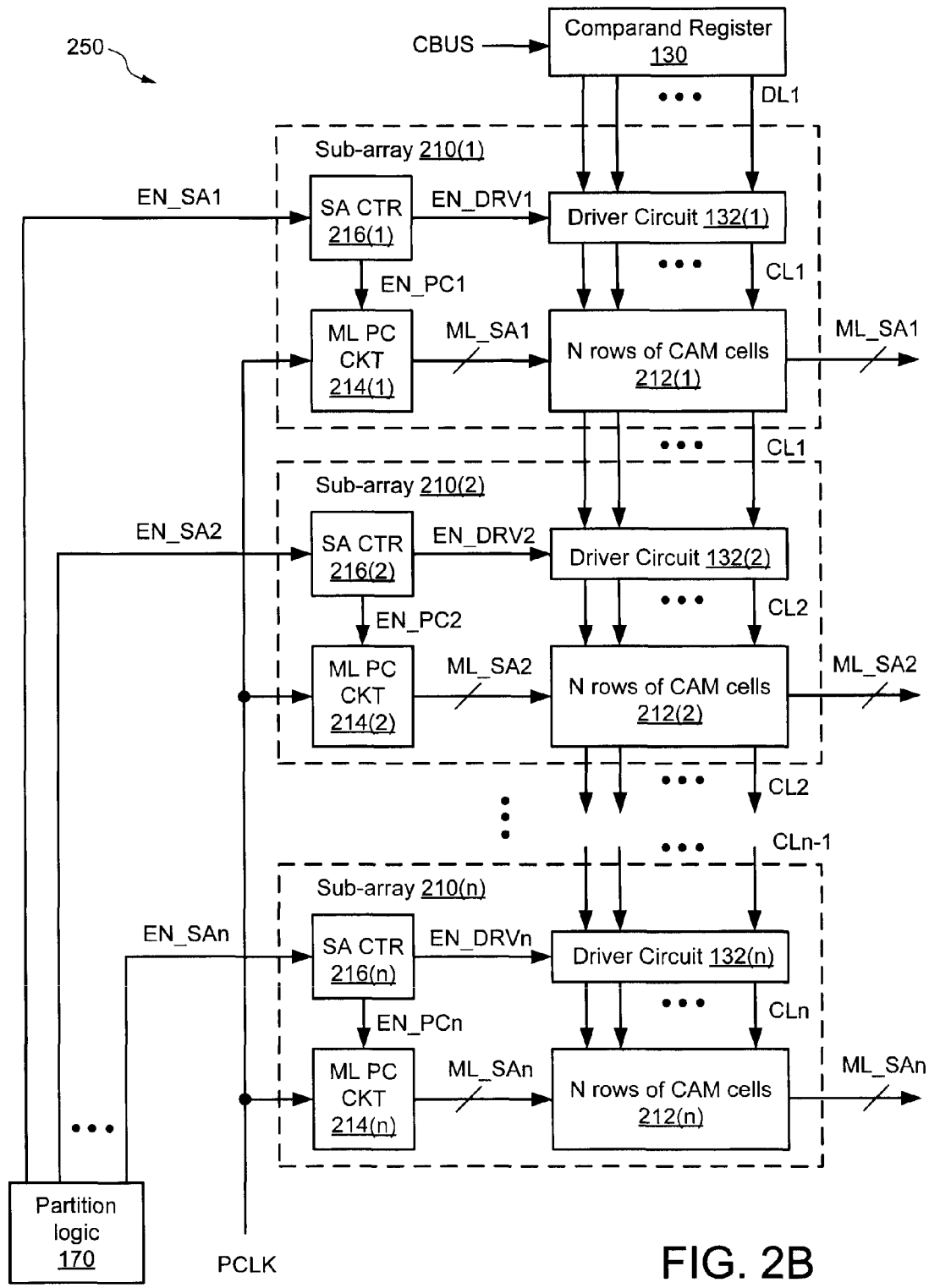
FIG. 2B is a functional block diagram of other embodiments of the CAM array of FIGS. 1A and 1B.

For example, FIG. 2B shows a CAM array 250 that is another embodiment of CAM array 110 of FIGS. 1A-1B. CAM array 250 of FIG. 2B is similar to CAM array 200 of FIG. 2A, except that each sub-array 210 of FIG. 2B includes a control circuit 216 having an input to receive EN_SA, a first output to provide a pre-charge enable signal (EN_PC) to the match line pre-charge circuit 214 in the sub-array 210, and a second output to provide a driver enable signal (EN_DRV) to the driver circuit 132 in the sub-array 210. In response to EN_SA, the control circuit 216 generates the enable signals EN_PC and EN_DRV for the corresponding sub-array 210. EN_PC selectively disables the match line pre-charge circuit 214, and EN_DRV selectively disables the driver circuit 132.

For example, if EN_PC1 is asserted, match line pre-charge circuit 214(1) pre-charges the match lines ML_SA1 of the first sub-array 210(1), and conversely, if EN_PC1 is de-asserted, match line pre-charge circuit 214(1) does not pre-charge match lines ML_SA1 of sub-array 210(1). Further, if EN_DRV1 is asserted, driver circuit 132(1) propagates the search key received from comparand register 130 down the first sub-array 210(1) by driving the search key onto the first sub-array's set of comparand line pairs CL1. Conversely, if EN_DRV1 is de-asserted, driver circuit 132(1) does not propagate the search key down the first sub-array 210(1), but rather drives the set of comparand line pairs CL1 to the same predetermined state (e.g., to an indeterminate state).

For embodiments of CAM array 250 of FIG. 2B, each control circuit 216 can drive the signals EN_PC and EN_DRV to different states to partially disable its corresponding sub-array 210 of CAM array 110. Using the example above in which the first and third sub-arrays 210(1) and 210(3) are selected for a compare operation, and the second sub-array 210(2) is not selected for the compare operation, the second sub-array 210(2) can be partially disabled so that it can propagate the search key from the first sub-array 210(1) to the third sub-array 210(3) via its comparand lines CL2 without pre-charging its match lines. More specifically, control circuit 216(2) can assert EN_DRV2 to enable driver circuit 132(2) to propagate the search key received from the comparand lines CL1 of first sub-array 210(1) to the driver circuit 132(3) of the third sub-array 210(3) via its comparand lines CL2, and can de-assert EN_PC2 to cause match line pre-charge circuit 214(2) to maintain its match lines ML_SA2 in a discharged state. In this manner, search keys can be propagated through partially disabled sub-arrays to reach non-contiguous enabled sub-arrays 210 while preventing the partially disabled sub-array 210 from participating in the compare operation, thereby also saving power by not alternately charging and discharging the match lines of the partially disabled sub-arrays 210.

Figure 3:
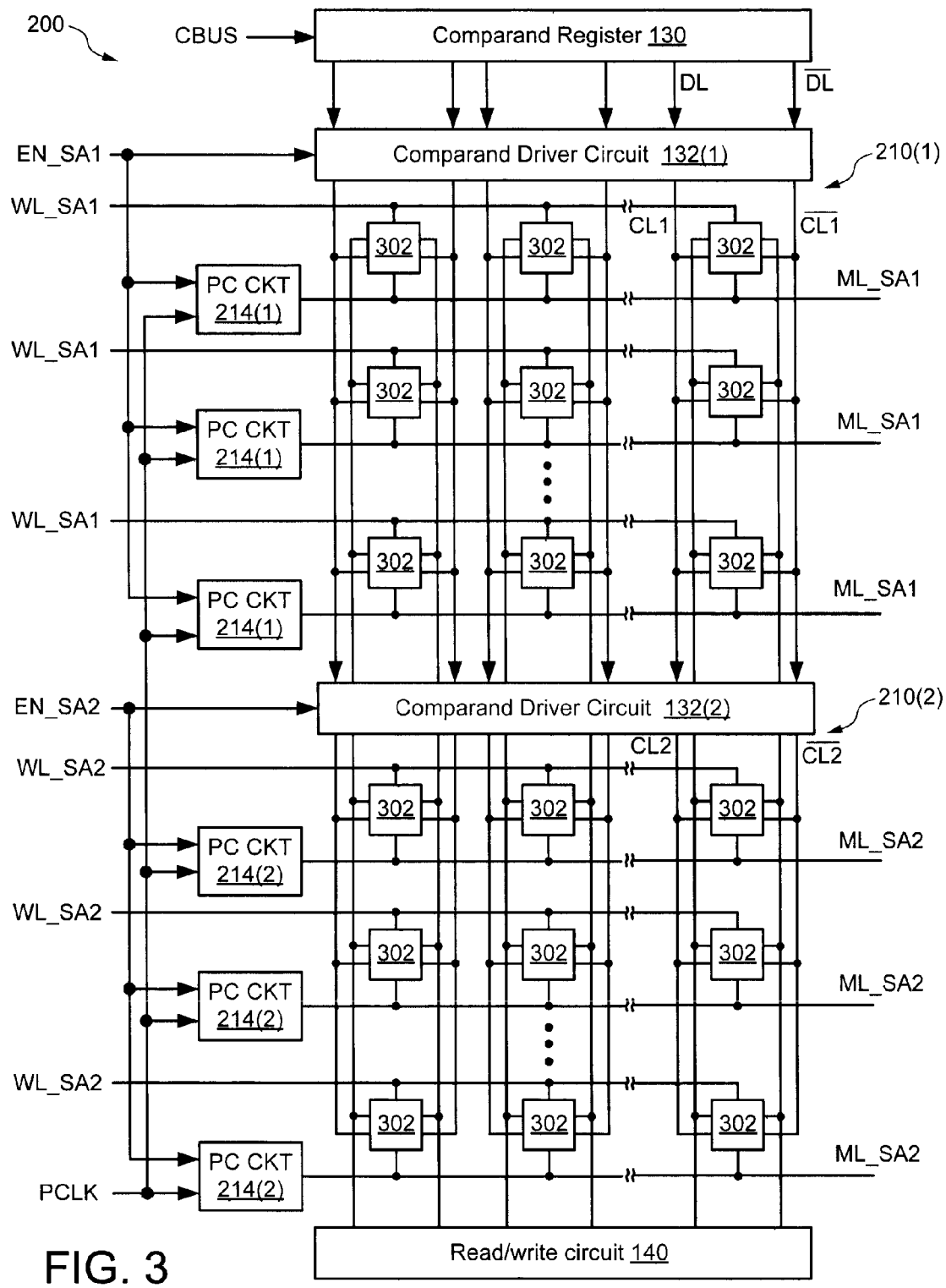
FIG. 3 is a more detailed block diagram of an exemplary embodiment of the CAM array of FIG. 2A.

FIG. 3 more clearly illustrates the connections between the sets of complementary comparand line pairs, the columns of CAM cells, and the driver circuits. CAM array 200 is shown in FIG. 3 as including two dynamically selectable CAM sub-arrays 210(1) and 210(2), as well as comparand register 130 and read/write circuit 140. Of course, for actual embodiments, CAM array 200 can include any number of sub-arrays 210. Each CAM sub-array 210 includes any number of rows of CAM cells 302, a corresponding number of match line pre-charge circuits 214, a comparand driver circuit 132, a set of complementary comparand line pairs CL and $\overline{CL}$, and a control input to receive a corresponding sub-array enable signal EN_SA. For simplicity, address decoder 120, priority encoder 150, and match logic 160 are not shown in FIG. 3.

Each CAM cell 302 may be a binary, ternary, quaternary, SRAM-based or DRAM-based CAM cell. Each row of CAM cells 302 is coupled to a match line ML and a word line WL. Each word line WL is driven by address decoder 120 (see also FIG. 1A) to select one or more rows of CAM cells 302 for writing or reading. Each match line ML provides the match results of a compare operation to the priority encoder 150 (see also FIG. 1A). The match lines are pre-charged for each compare operation. During the compare operation, a match line ML indicates a match condition for the row only if all CAM cells 302 in that row match the comparand data, in which case the match line remains in its charged (e.g., logic high) state. If any CAM cell 302 in a row does not match the corresponding bit of the search key, the CAM cell 302 discharges the match line (e.g., to ground potential) to indicate the mismatch condition.

Each column of CAM cells 302 is coupled to a bit line BL and a complementary bit line $\overline{BL}$. The bit lines BL and $\overline{BL}$ are coupled to read/write circuit 140, which can write data to and/or read data from an addressed row of CAM cells 302. Within each sub-array 210, each column of CAM cells is coupled to a comparand line CL and to a complementary comparand line $\overline{CL}$. The complementary comparand line pair CL and $\overline{CL}$ are selectively driven by the sub-array's driver circuit 132 in response to the corresponding EN_SA signal. For example, the columns of CAM cells of sub-array 210(1) are connected to comparand line pairs CL1 and $\overline{CL1}$, which are selectively driven by driver circuit 132(1) in response to EN_SA1. The columns of CAM cells of sub-array 210(2) are connected to comparand line pairs CL2 and $\overline{CL2}$, which are selectively driven by driver circuit 132(2) in response to EN_SA2. For each column of CAM cells, the comparand line CL drives a corresponding bit of the search key to the CAM cells in the column, and the complementary comparand line $\overline{CL}$ drives the logical complement of the search key bit to the CAM cells in the column.

As described above, the driver circuits 132 selectively propagate the search key through the sub-arrays 210 in response to the sub-array enable signals. For example, driver circuit 132(1) receives the search key from comparand register 130 via complementary data lines DL and $\overline{DL}$, and selectively propagates the search key to the CAM cells of first sub-array 210(1) in response to EN_SA1. Thus, if EN_SA1 is asserted, driver circuit 132(1) drives the search key onto complementary comparand lines CL1 and $\overline{CL1}$ so that the rows of CAM cells in the first sub-array 210(1) receive the search key for the compare operation. Similarly, driver circuit 132(2) receives the search key from the first sub-array 210(1) via CL1 and $\overline{CL1}$, and selectively propagates the search key to the CAM cells of second sub-array 210(2) in response to EN_SA2. Thus, if EN_SA2 is asserted, driver circuit 132(2) drives the search key onto complementary comparand lines CL2 and $\overline{CL2}$ so that the rows of CAM cells in the second sub-array 210(2) receive the search key for the compare operation.

Further, as described above, each pre-charge circuit 214(1) of the first sub-array 210(1) includes inputs to receive PCLK and EN_SA1, includes an output coupled to the match line ML_SA1 in a corresponding row of first sub-array 210(1), and is configured to selectively pre-charge its corresponding match line upon assertion of PCLK in response to the logic state of EN_SA1. Similarly, each pre-charge circuit 214(2) of the second sub-array 210(2) includes inputs to receive PCLK and EN_SA2, includes an output coupled to the match line ML_SA2 in a corresponding CAM row of second sub-array 210(2), and is configured to selectively pre-charge its corresponding match line upon assertion of PCLK in response to the logic state of EN_SA2.

As mentioned above, if a CAM sub-array 210 is disabled in response to its sub-array enable signal, the match lines of the sub-array 210 are not pre-charged (e.g., to logic high) prior to the compare operation, but rather remain in a discharged state, thereby reducing power consumption associated with repeatedly charging and discharging the match lines of the CAM array. Further, if a CAM sub-array 210 is disabled, its driver circuit 132 does not drive the search key onto the sub-array's complementary comparand lines CL and $\overline{CL}$ during the compare operation, but rather maintains the sub-array's complementary comparand lines CL and $\overline{CL}$ in a logic low state, thereby eliminating power consumption associated with driving the sub-array's complementary comparand lines CL and $\overline{CL}$ to opposite states representative of the search key. Thus, by not pre-charging the match lines of the disabled sub-arrays and/or by not driving the search key into the disabled sub-arrays, power consumption associated with performing compare operations can be significantly reduced when one or more of the sub-arrays 210 are disabled for the compare operation.

In alternate embodiments, other CAM array architectures may be used. For example, in some embodiments, CAM array 200 may not include complementary comparand lines CL and $\overline{CL}$, in which case the complementary bit lines BL and $\overline{BL}$ may be coupled to the comparand drivers 132 and be used to perform a compare operation as is generally known in the art. For example, in the first part of a compare cycle, compare data may be selectively driven onto BL and $\overline{BL}$, and during the second part of the compare cycle, BL and $\overline{BL}$ may be driven with data to be output from CAM array 200. For other embodiments, only one of comparand lines CL and $\overline{CL}$ or bit lines BL and $\overline{BL}$ may be needed.

Figure 4A:
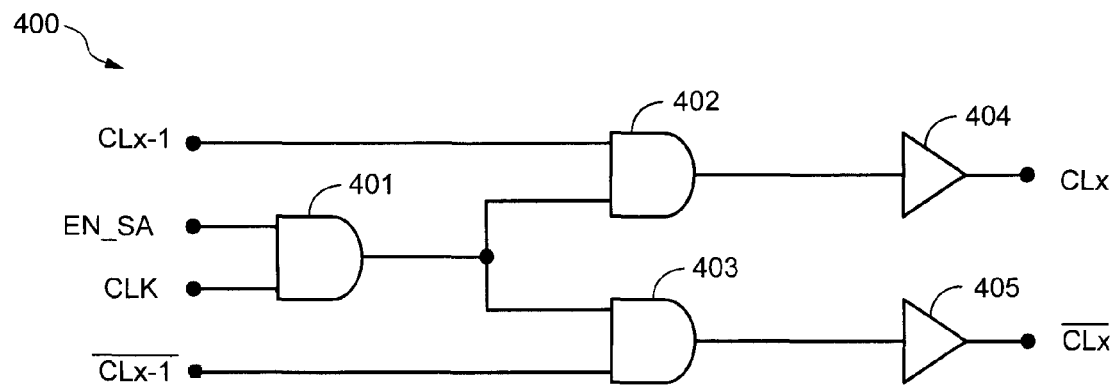
FIG. 4A is a circuit diagram of one embodiment of the comparand driver of FIG. 3.

FIG. 4A shows a 1-bit, dynamically selectable comparand driver 400 that can be used to form the comparand drivers 132 to drive a complementary comparand line pair CLx and $\overline{CLx}$ of a CAM sub-array 210(x) with a corresponding bit of the search key. Driver 400 includes AND gates 401-403 and buffers 405-406. AND gate 401 includes input terminals to receive a compare clock signal CLK and EN_SA, and includes an output terminal coupled to first input terminals of AND gates 402 and 403. AND gate 402 includes a second input terminal coupled to the comparand line CLx-1 of a previous sub-array 210(x-1), and an output terminal coupled to the input of buffer 404. Buffer 404, which is well-known, can drive the search key bit onto comparand line CLx of sub-array 210(x). AND gate 403 includes a second input terminal coupled to the complementary comparand line $\overline{CLx\text{-}1}$ of the previous sub-array 210(x-1), and an output terminal coupled to the input of buffer 405. Buffer 405, which is well-known, can drive the logical complement of the search key bit onto complementary comparand line $\overline{CLx}$ of sub-array 210(x). For some embodiments, a plurality of drivers 400 can share the same AND gate 401.

During a compare operation, a bit of the search key is provided to AND gate 402 via comparand line CLx-1, and its logical complement is provided to AND gate 403 via complementary comparand line $\overline{CLx\text{-}1}$. If EN_SA is asserted (e.g., to logic high), CLK propagates through AND gate 401 to AND gates 402 and 403. When CLK transitions to logic high, AND gate 402 passes the search key bit to buffer 404, which in turn drives the search key bit onto the comparand line CLx. Similarly, AND gate 403 passes the complementary search key bit to buffer 405, which in turn drives the complementary search key bit onto the complementary comparand line $\overline{CLx}$. Thus, when EN_SA is asserted, the comparand driver 400 drives the comparand lines CLx and $\overline{CLx}$ of sub-array 210(x) with the search key received from the previous sub-array 210(x-1) via comparand lines CLx-1 and $\overline{CLx\text{-}1}$, respectively.

Conversely, if EN_SA is de-asserted (e.g., to logic low), the output of AND gate 401 is forced to logic low, which in turn forces the outputs of AND gates 402 and 403 to logic low. In response thereto, buffer 404 forces CLx to logic low, and buffer 405 forces $\overline{CLx}$ to logic low. In this manner, when EN_SA is de-asserted, the comparand driver 400 drives both the comparand line CLx and the complementary comparand line $\overline{CLx}$ to logic low, thereby not only preventing CAM sub-array 210(x) from receiving the search key (or participating in the compare operation) but also reducing power consumption by not having to charge one of the complementary comparand lines CLx or $\overline{CLx}$ to logic high during the compare operation.

Figure 4B:
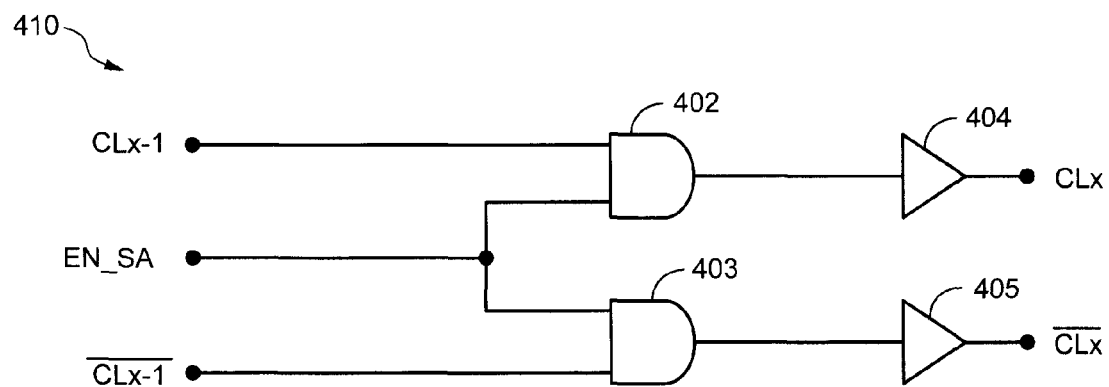
FIG. 4B is a circuit diagram of another embodiment of the comparand driver of FIG. 3.

FIG. 4B shows another 1-bit, dynamically selectable comparand driver 410 that can be used to form the comparand drivers 132 to drive a complementary comparand line pair CLx and $\overline{CLx}$ of a CAM sub-array 210(x) with a corresponding bit of the search key. Comparand driver 410 is similar to comparand driver 400 of FIG. 4A, except that comparand driver 410 does not include AND gate 401 to receive the clock signal CLK, and therefore operates in an asynchronous manner.

FIG. 5A shows a match line pre-charge circuit 500 that is one embodiment of the match line pre-charge circuit 214 of FIGS. 2A, 2B, and 3. Pre-charge circuit 500 includes a PMOS pull-up transistor MP1, a D-type flip-flop 501, an inverter 502, and a PMOS pull-up transistor MP2. Flip-flop 501 has a clock input (<) to receive PCLK, has a data input (D) to receive an enable signal (EN), and has an output (Q) to provide EN to an input of inverter 501 upon triggering edges of PCLK. The enable signal EN of FIG. 5A can be either the EN_SA signal of FIGS. 2A and 3, or the EN_PC signal of FIG. 2B. For other embodiments, EN and PCLK can be gated together in a suitable logical circuit (e.g., an AND or NAND type gate) to generate the input signal to inverter 502. For the present embodiments, PCLK is a self-timed clock signal that can be generated or derived from a system clock, as known in the art. For other embodiments, other techniques can be used to generate the EN and PCLK signals.

Inverter 501 logically inverts EN to generate $\overline{EN}$, which is provided to the gate of PMOS pull-up transistor MP1, which is connected between VDD and ML_SA. PMOS transistor MP2 is connected between VDD and ML_SA and has a gate tied to ground potential, and thus MP2 remains conductive. For present embodiments, PMOS transistor MP2 is a weak pull-up transistor that serves to maintain ML_SA in its fully charged state after the de-assertion of PCLK turns off PMOS pull-up transistor MP1 (e.g., to prevent inadvertent charge loss). For other embodiments, PMOS transistor MP2 can be eliminated.

Prior to compare operations, EN is asserted for a predetermined time to cause the match line pre-charge circuits 500 of the corresponding enabled sub-array to pre-charge their match lines for the compare operation. When PCLK transitions to logic high, flip-flop 501 clocks the logic high state of EN and drives its Q output to logic high. In response thereto, inverter 502 drives $\overline{EN}$ to logic low, which turns on PMOS transistor MP1. PMOS transistor MP1 then charges ML_SA to logic high (e.g., toward VDD). During compare operations, EN transitions to logic low, thus turning off MP1 to terminate the pre-charge operation. If any of the CAM cells (not shown in FIG. 5A for simplicity) coupled to ML_SA contain data that does not match the search key, the one or more mismatching CAM cells discharge ML_SA to logic low (e.g., toward ground potential) to indicate the mismatch condition. Otherwise, if all the CAM cells coupled to ML_SA contain matching data, the CAM cells do not discharge ML_SA, and weak pull-up transistor MP2 remains conductive and helps to maintain ML_SA in its logic high state to indicate the match condition.

Conversely, if prior to the compare operation EN is de-asserted to logic low to disable the corresponding CAM sub-array 111 by preventing the pre-charge circuits 500 from pre-charging their associated match lines, flip-flop 501 clocks its logic low state upon the triggering edge of PCLK and drives its Q output to logic low. In response thereto, inverter 502 drives $\overline{EN}$ to logic high, which turns off PMOS transistor MP1 to isolate ML_SA from VDD. In this manner, the match line pre-charge circuit 500 maintains ML_SA in its discharged state, thereby not only preventing the row of CAM cells coupled to ML_SA from participating in the compare operation, but also reducing power consumption by not alternately charging and discharging ML_SA during compare operations.

FIG. 5B shows a match line pre-charge circuit 510 that is another embodiment of the match line pre-charge circuit 214 of FIGS. 2A and 3. Pre-charge circuit 510 is similar to pre-charge circuit 500 of FIG. 5A, except that the gate of weak PMOS pull-up transistor MP2 is coupled to $\overline{EN}$ rather than tied to ground potential, and an NMOS pull-down transistor is connected between ML and ground potential with its gate coupled to receive $\overline{EN}$. Transistors MP1 and MN1 form a CMOS inverter 503. In this manner, the weak pull-up transistor MP2 is conductive only when EN is asserted to enable the row of CAM cells for compare operations. Thus, when EN is de-asserted to disable the CAM row for compare operations, the weak pull-up transistor MP2 is not conductive, and therefore may reduce DC current flow in pre-charge circuit 510. Further, when $\overline{EN}$ is in a logic low state, NMOS pull-down transistor MN1 turns on and discharges ML toward ground potential.

FIG. 5C shows a match line pre-charge circuit 520 that is another embodiment of the match line pre-charge circuit 214 of FIGS. 2A and 3. Pre-charge circuit 520 is similar to pre-charge circuit 510 of FIG. 5B, and also includes self-timed logic 525 coupled between flip-flop 501 and inverter 502. Self-timed logic 525 includes a plurality of delay elements 527 (e.g., shown as inverters in FIG. 5C) and an AND gate 526 that collectively operate to generate an enable signal EN' that has an asserted pulse width that is a fraction of the asserted pulse width of EN. Circuit 520 also includes an inverter 504 having an input to receive the flip-flop output signal Q and an output to provide its complement Q to the gates of transistors MN1 and MP2. When Q is logic high, Q is logic low and turns off pull-down transistor MN1 and turns on weak pull-up transistor MP2, thereby allowing the asserted signal EN to turn on pull-up transistor MP1 via self-timed circuit 525 and inverter 502 and thus pre-charge ML toward VDD. When Q is logic low, Q is logic high and turns on pull-down transistor MN1 and turns off weak pull-up transistor MP2, thereby discharging ML toward ground potential.

FIG. 5D shows a match line pre-charge circuit 530 that is another embodiment of the match line pre-charge circuit 214 of FIGS. 2A and 3. Pre-charge circuit 530 is similar to pre-charge circuit 520 of FIG. 5B, except that the Q output of flip-flop 501 is provided as a reset signal to flip-flop 501 via a number of delay elements 531. In this manner, assertion of the flip-flop output signal Q resets Q to logic low after a time delay associated with the delay elements 531.

Figure 6:
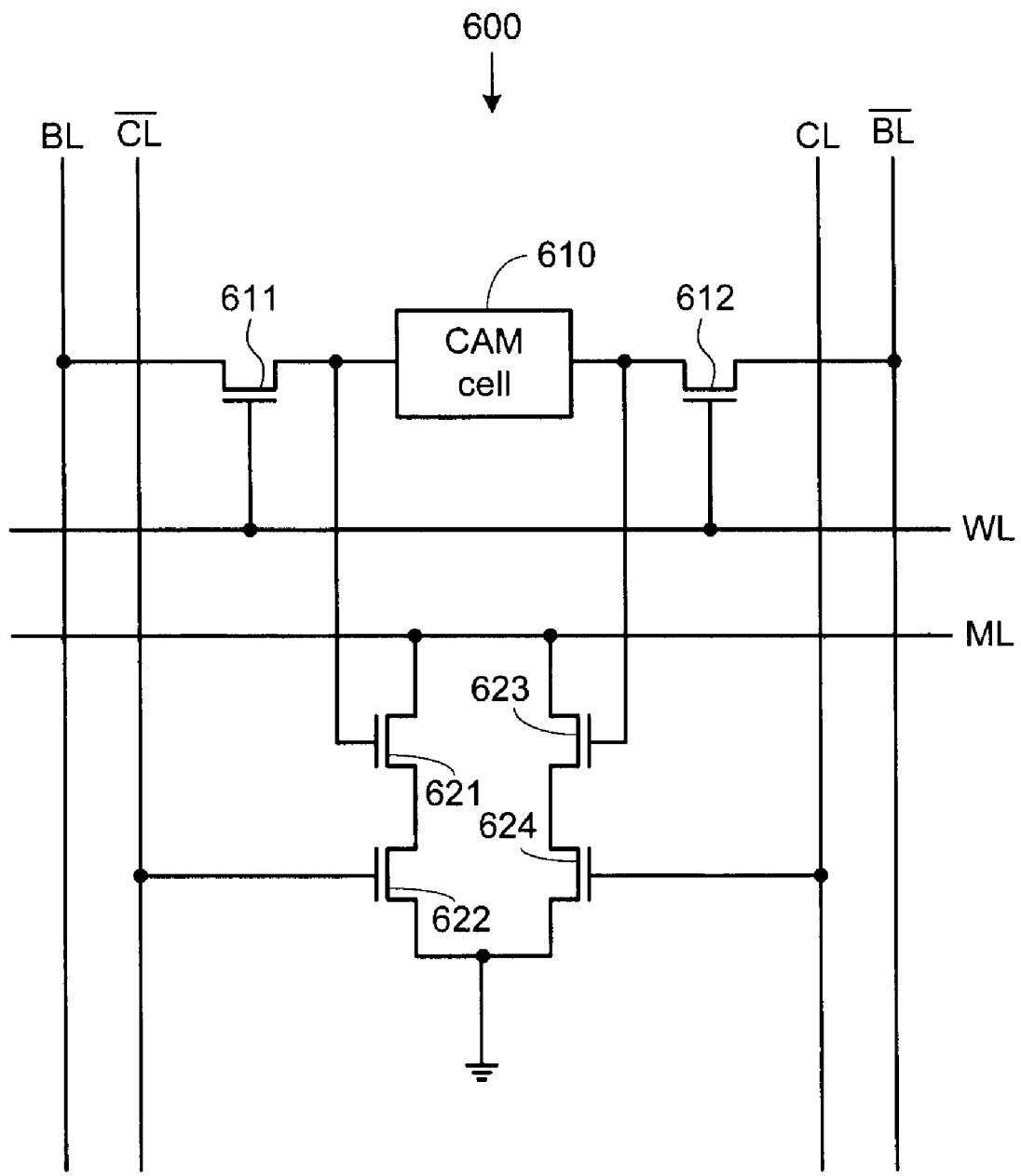
FIG. 6 is a block diagram of an exemplary binary CAM cell that can be employed in the present embodiments.
Figure 7A:
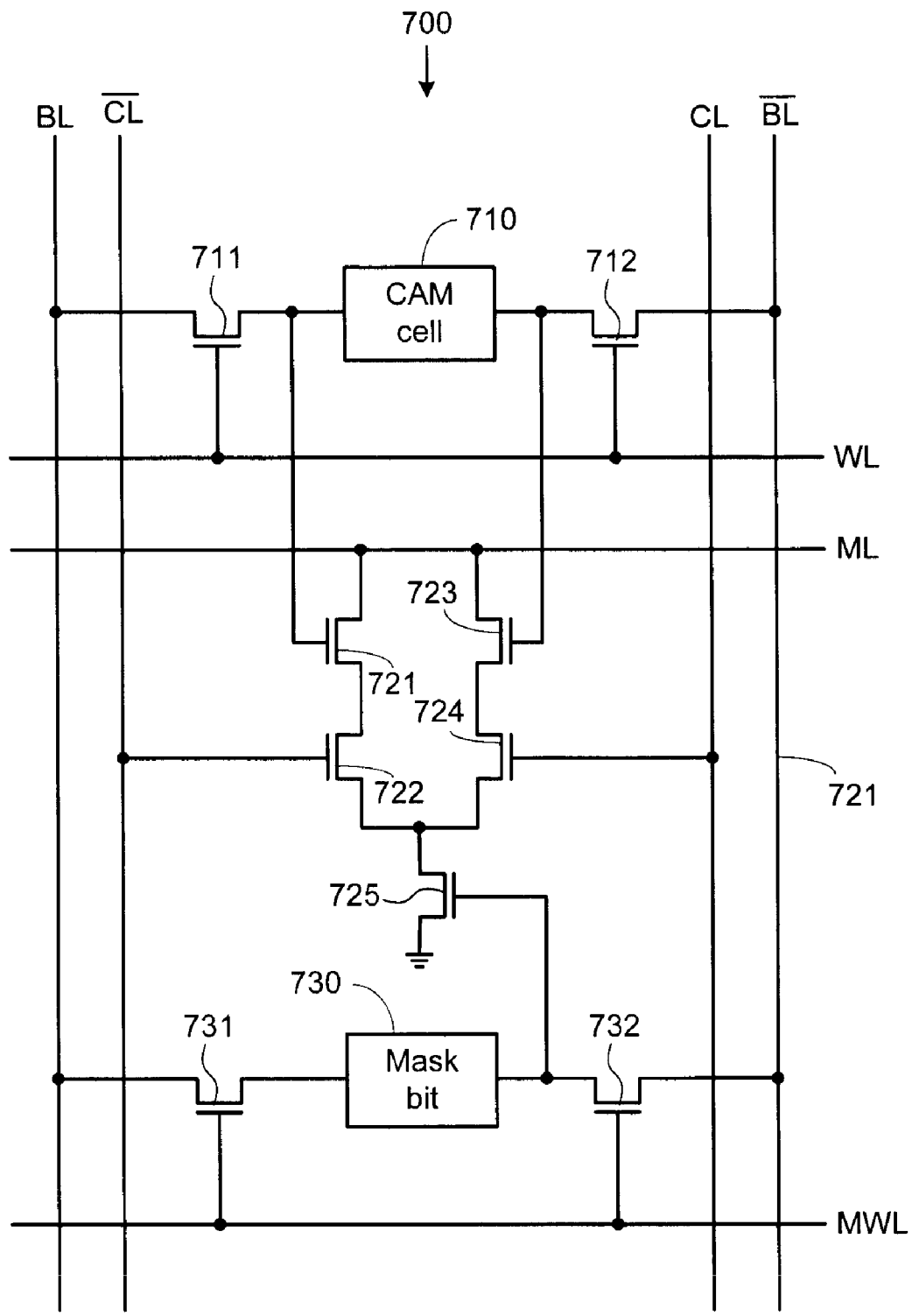
FIG. 7A is a block diagram of one exemplary ternary CAM cell that can be employed in the present embodiments.
Figure 7B:
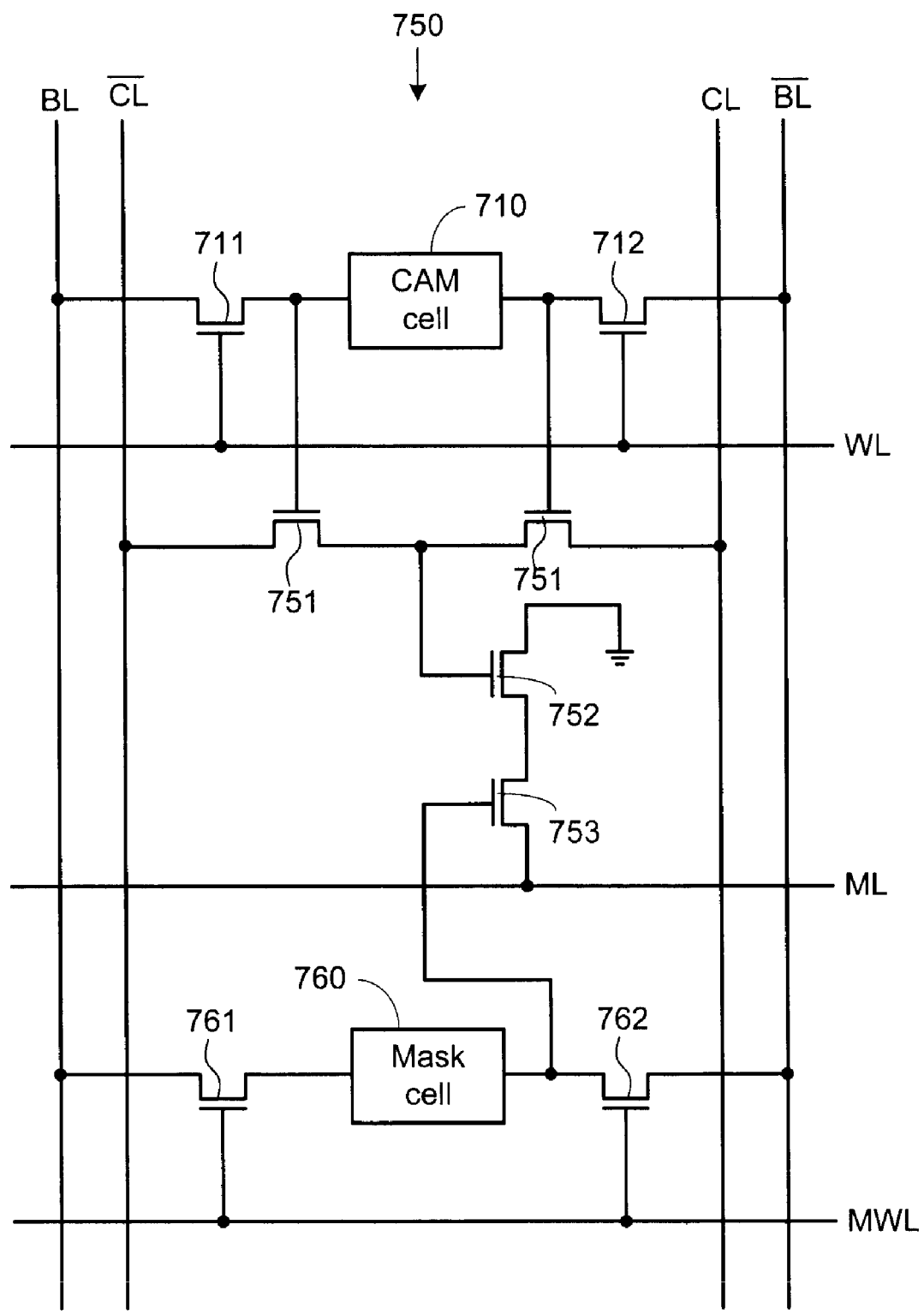
FIG. 7B is a block diagram of another exemplary ternary CAM cell that can be employed in the present embodiments.

As mentioned above, CAM arrays 110 of the present embodiments can employ any suitable type of CAM cell. For example, FIG. 6 shows a circuit diagram of a well-known binary CAM cell 600, and FIGS. 7A and 7B show well-known ternary CAM cell architectures 700 and 750, respectively. The operations of binary CAM cell architecture 600 and ternary CAM cell architectures 700 and 750 are well-known, and therefore are not described in detail herein. For other embodiments, CAM arrays in accordance with the present embodiments can employ other suitable CAM cell architectures.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A content addressable memory (CAM) device, comprising:
   a comparand register having inputs to receive a search key;
   a CAM array including a plurality of individually selectable sub-arrays, each sub-array including a number of rows of CAM cells and a control circuit, wherein each row of CAM cells is coupled to a match line, and wherein each control circuit has an input to receive a corresponding sub-array enable signal; and
   partition logic having an input to receive a partition select signal and configured to generate the sub-array enable signals in response to the partition select signal, wherein the control circuits selectively propagate the search key through the sub-arrays of the CAM array in response to the sub-array enable signals, and wherein for each sub-array, if its sub-array enable signal is asserted, its control circuit propagates the search key received from a previous sub-array to the rows of CAM cells in the sub-array for a compare operation.

2. The CAM device of claim 1, wherein each sub-array is independently enabled for the compare operation in response to its corresponding sub-array enable signal.

3. The CAM device of claim 1, wherein if the sub-array enable signal is asserted, the control circuit pre-charges the match lines of the sub-array for the compare operation.

4. The CAM device of claim 1, wherein for each sub-array, if its sub-array enable signal is de-asserted, its control circuit does not propagate the search key to the CAM cells of the sub-array for the compare operation.

5. The CAM device of claim 4, wherein if the sub-array enable signal is de-asserted, the control circuit does not pre-charge the match lines of the sub-array for the compare operation.

6. The CAM device of claim 1, wherein each control circuit comprises:
a driver circuit having data outputs connected to a set of comparand lines in the corresponding sub-array, having data inputs connected to a set of comparand lines in the previous sub-array, and having a control input to receive the corresponding sub-array enable signal, wherein the set of comparand lines in each sub-array are connected to corresponding columns of CAM cells in the sub-array.

7. The CAM device of claim 6, wherein the driver circuit in a first sub-array has data inputs to receive the search key from the comparand register, has data outputs connected to the set of comparand lines in the first sub-array, and is configured to selectively drive the search key onto the set of comparand lines in the first sub-array in response to a first sub-array enable signal.

8. The CAM device of claim 6, wherein for each sub-array, its driver circuit selectively propagates the search key received from the set of comparand lines in the previous sub-array onto the set of comparand lines of the sub-array in response to the corresponding sub-array enable signal.

9. The CAM device of claim 8, wherein for each sub-array, each of the comparand lines comprises a comparand line and a complementary comparand line pair that provides a search key bit and its logical complement, respectively, to the corresponding column of CAM cells in the sub-array, and wherein if the corresponding sub-array enable signal is de-asserted, its driver circuit maintains both the comparand line and the complementary comparand line in a logic low state.

10. The CAM device of claim 6, wherein each control circuit further comprises:
a number of match line pre-charge circuits, each match line pre-charge circuit coupled between a supply voltage and one of the match lines of the corresponding sub-array, having a first input to receive a pre-charge clock signal, and having a second input to receive the corresponding sub-array enable signal.

11. The CAM device of claim 10, wherein for each sub-array, the match line pre-charge circuits selectively pre-charge their sub-array's match lines upon assertion of the pre-charge clock signal in response to the corresponding sub-array enable signal.

12. A content addressable memory (CAM) device, comprising:
a comparand register having inputs to receive a search key
a CAM array including a plurality of individually selectable sub-arrays, each sub-array including a number of rows of CAM cells and a control circuit, wherein each row of CAM cells is coupled to a match line, and wherein each control circuit has an input to receive a corresponding sub-array enable signal; and
partition logic having an input to receive a partition select signal and configured to generate the sub-array enable signals in response to the partition select signal, wherein the control circuits selectively propagate the search key through the sub-arrays of the CAM array in response to the sub-array enable signals, wherein the partition select signal identifies a number of CAM sub-arrays to be partially disabled for a compare operation, and wherein for each partially disabled sub-array, the sub-array's control circuit propagates the search key received from a previous sub-array to a next sub-array, and maintains the match lines of the partially disabled sub-array in a discharged state.

13. A content addressable memory (CAM) device, comprising:
a comparand register having inputs to receive a search key;
a CAM array including a number of individually selectable sub-arrays, each sub-array comprising:
a plurality of CAM cells arranged in any number of rows and columns, wherein each row of CAM cells is coupled to a match line;
a set of comparand lines, each comparand line coupled to a corresponding column of CAM cells in the sub-array; and
a driver circuit having data outputs connected to the set of comparand lines in the sub-array, having data inputs connected to the set of comparand lines in a previous sub-array, and having a control input to receive a corresponding sub-array enable signal; and
partition logic having an input to receive a partition select signal and configured to generate the sub-array enable signals in response to the partition select signal.

14. The CAM device of claim 13, wherein each sub-array is independently enabled for a compare operation in response to its corresponding sub-array enable signal.

15. The CAM device of claim 13, wherein the search key is selectively propagated from the comparand register through the sub-arrays of the CAM array in response to the sub-array enable signals.

16. The CAM device of claim 13, wherein for each sub-array, its driver circuit selectively propagates the search key received from the comparand lines in the previous sub-array onto the comparand lines of the sub-array in response to the corresponding sub-array enable signal.

17. The CAM device of claim 13, wherein for each sub-array, if the corresponding sub-array enable signal is asserted, its driver circuit propagates the search key received from the previous sub-array onto the comparand lines of the sub-array, and if the corresponding sub-array enable signal is de-asserted, its driver circuit maintains the comparand lines of the sub-array in an indeterminate state.

18. The CAM device of claim 17, wherein for each sub-array, each of the comparand lines comprises a complementary comparand line pair that provides a search key bit and its logical complement to the corresponding column of CAM cells in the sub-array, wherein if the corresponding sub-array enable signal is de-asserted, its driver circuit maintains both the comparand lines in a logic low state.

19. The CAM device of claim 13, wherein each sub-array further comprises:
a number of match line pre-charge circuits, each match line pre-charge circuit coupled between a supply voltage and a match line of a corresponding row of CAM cells of the sub-array, having a first input to receive a pre-charge clock signal, and having a second input to receive the corresponding sub-array enable signal.

20. The CAM device of claim 19, wherein for each sub-array, the match line pre-charge circuits selectively pre-charge their sub-array's match lines upon assertion of the pre-charge clock signal in response to the corresponding sub-array enable signal.

21. The CAM device of claim 19, wherein for each sub-array, if the corresponding sub-array enable signal is asserted, the match line pre-charge circuits pre-charge their sub-array's match lines to logic high prior to the compare operation, and if the corresponding sub-array enable signal is de-asserted, the match line pre-charge circuits maintain their sub-array's match lines in a logic low state indicative of a mismatch condition.

22. The CAM device of claim 19, wherein the partition select signal identifies a number of sub-arrays to be partially disabled for the compare operation.

23. The CAM device of claim 22, wherein for each partially disabled sub-array, the sub-array's driver circuit propagates the search key received from a previous sub-array to a next sub-array, and the match line pre-charge circuits do not charge the match lines of the rows of CAM cells in the sub-array.

24. A content addressable memory (CAM) device, comprising:
a CAM array having a plurality of individually selectable sub-arrays, each sub-array including a number of rows of CAM cells and including a control circuit, wherein each row of CAM cells is connected to a same address decoder via a corresponding word line and is connected to a same priority encoder via a corresponding match line, wherein each control circuit has an input to receive a corresponding sub-array enable signal that indicates whether the sub-array is to be enabled or disabled for compare operations; and
partition logic having an input to receive a partition select signal and configured to generate the sub-array enable signals in response to the partition select signal; and
a comparand register having inputs to receive a search key and having outputs coupled to the CAM array, wherein during compare operations, the search key is selectively propagated from the comparand register sequentially through the sub-arrays in response to the sub-array enable signals.

25. The CAM device of claim 24, wherein the partition select signal identifies a number of the sub-arrays to be partially disabled for the compare operation.

26. The CAM device of claim 25, wherein for each partially disabled sub-array, the sub-array's control circuit propagates the search key received from a previous sub-array to a next sub-array, and maintains the match lines of the partially disabled sub-array in a discharged state.

27. The CAM device of claim 24, wherein each sub-array further comprises a set of comparand lines, each comparand line coupled to the CAM cells in a corresponding column of the sub-array, and each control circuit further comprises:
a driver circuit having data outputs connected to the set of comparand lines in the sub-array, having data inputs connected to the set of comparand lines in a previous sub-array, and having a control input responsive to the corresponding sub-array enable signal.

28. The CAM device of claim 27, wherein for each sub-array, its driver circuit selectively propagates the search key received from the comparand lines in the previous sub-array onto the comparand lines of the sub-array in response to the corresponding sub-array enable signal.

29. The CAM device of claim 27, wherein for each CAM sub-array, if the corresponding sub-array enable signal is asserted, its driver circuit propagates the search key received from the previous CAM sub-array onto the comparand lines of the sub-array, and if the corresponding sub-array enable signal is de-asserted, its driver circuit maintains the comparand lines of the sub-array in an indeterminate state.

30. The CAM device of claim 29, wherein for each CAM sub-array, each of the comparand lines comprises a complementary comparand line pair that provide a search key bit and its logical complement to the corresponding column of CAM cells in the sub-array, wherein if the corresponding sub-array enable signal is de-asserted, its driver circuit maintains both the comparand lines in a logic low state.

31. The CAM device of claim 27, wherein each control circuit further comprises:
a number of match line pre-charge circuits, each match line pre-charge circuit coupled between a supply voltage and the match line of a corresponding row of the sub-array, having a first input to receive a pre-charge clock signal, and having a second input to receive the corresponding sub-array enable signal.

32. The CAM device of claim 31, wherein for each sub-array, the match line pre-charge circuits selectively pre-charge their sub-array's match lines upon assertion of the pre-charge clock signal in response to the corresponding sub-array enable signal.

33. The CAM device of claim 24, wherein for each sub-array, if the corresponding sub-array enable signal is asserted, the sub-array's control circuit pre-charges the match lines of the rows of CAM cells in the sub-array and propagates the search key received from a previous sub-array to the rows of CAM cells in the sub-array for the compare operation.

34. The CAM device of claim 33, wherein for each sub-array, if the corresponding sub-array enable signal is de-asserted, the sub-array's control circuit does not pre-charge the match lines of the rows of CAM cells in the sub-array and does not propagate the search key received from a previous sub-array to the rows of CAM cells in the sub-array for the compare operation.

35. A method of minimizing power consumption during a compare operation between a search key and data stored in a content addressable memory (CAM) array having a plurality of individually selectable sub-arrays each including one or more rows of CAM cells coupled to corresponding match lines, the method comprising:
providing the search key to the CAM array;
generating a plurality of sub-array enable signals in response to a partition select signal that indicates which of the sub-arrays are to be enabled for the compare operation; and
selectively propagating the search key through the sub-arrays in response to the sub-array enable signals, wherein the selectively propagating comprises, for each sub-array:
if the corresponding sub-array enable signal is asserted, driving the search key received from a previous sub-array onto a set of comparand lines of the sub-array; and
if the corresponding sub-array enable signal is de-asserted, driving the set of comparand lines of the sub-array to an indeterminate state.

36. The method of claim 35, further comprising:
selectively pre-charging the match lines of each sub-array in response to its sub-array enable signal.

37. A method of minimizing power consumption during a compare operation between a search key and data stored in a content addressable memory (CAM) array having a plurality of individually selectable sub-arrays each including one or more rows of CAM cells coupled to corresponding match lines, the method comprising:
providing the search key to the CAM array;
generating a plurality of sub-array enable signals in response to a partition select signal that indicates which of the sub-arrays are to be enabled for the compare operation:
selectively propagating the search key through the sub-arrays in response to the sub-array enable signals; and
partially disabling one of the sub-arrays, wherein the partially disabling comprises:

driving the search key received from a previous sub-array to a next sub-array via the set of comparand lines of the partially disabled sub-array; and maintaining the match lines of the partially disabled sub-array in a discharged state to prevent the CAM cells of the partially disabled sub-array from participating in the compare operation.

38. An apparatus for minimizing power consumption during a compare operation between a search key and data stored in a content addressable memory (CAM) array including a plurality of individually selectable sub-arrays each including one or more rows of CAM cells coupled to corresponding match lines, the apparatus comprising:

means for providing the search key to the CAM array;

means for generating a plurality of sub-array enable signals in response to a partition select signal that indicates which of the sub-arrays are to be enabled for the compare operation; and means for selectively propagating the search key through the sub-arrays in response to the sub-array enable signals, wherein the means for selectively propagating comprises, for each sub-array:

means for driving the search key received from a previous sub-array onto a set of comparand lines of the sub-array if the corresponding sub-array enable signal is asserted; and means for driving the set of comparand lines of the sub-array to an indeterminate state if the corresponding sub-array enable signal is de-asserted.

39. The apparatus of claim 38, further comprising:

means for selectively pre-charging the match lines of each sub-array in response to its sub-array enable signal.

40. An apparatus for minimizing power consumption during a compare operation between a search key and data stored in a content addressable memory (CAM) array including a plurality of individually selectable sub-arrays each including one or more rows of CAM cells coupled to corresponding match lines, the apparatus comprising:

means for providing the search key to the CAM array;

means for generating a plurality of sub-array enable signals in response to a partition select signal that indicates which of the sub-arrays are to be enabled for the compare operation;

means for selectively propagating the search key through the sub-arrays in response to the sub-array enable signals; and means for partially disabling one of the sub-arrays, wherein the partially disabling comprises:

means for driving the search key received from a previous sub-array to a next sub-array via the set of comparand lines of the partially disabled sub-array; and means for maintaining the match lines of the partially disabled sub-array in a discharged state to prevent the CAM cells of the partially disabled sub-array from participating in the compare operation.

* * * * *